United States Patent [19]
Koyasu et al.

[11] Patent Number: 5,629,702
[45] Date of Patent: May 13, 1997

[54] ANALOG TO DIGITAL CONVERTER

[75] Inventors: Takahisa Koyasu, Chita; Mitsuhiro Saitou, Oobu, both of Japan

[73] Assignee: Nippondenso Co., Ltd., Kariya, Japan

[21] Appl. No.: 318,546

[22] Filed: Oct. 5, 1994

[30] Foreign Application Priority Data

Oct. 5, 1993 [JP] Japan .................................. 5-274986

[51] Int. Cl.⁶ .................................................. H03M 1/66
[52] U.S. Cl. ........................ 341/155; 341/158; 341/161; 341/162; 327/80
[58] Field of Search ................................ 341/161, 162, 341/158, 155; 327/80

[56] References Cited

U.S. PATENT DOCUMENTS

| | | | |
|---|---|---|---|
| 3,968,486 | 7/1976 | Gerdes | 340/347 AD |
| 4,542,370 | 9/1985 | Yamada et al. | 340/347 AD |
| 5,014,054 | 5/1991 | Oshita et al. | 341/145 |

FOREIGN PATENT DOCUMENTS

| | | |
|---|---|---|
| 59-161917 | 9/1984 | Japan . |
| 63-74322 | 4/1988 | Japan . |

OTHER PUBLICATIONS

"Reference Voltage of a Window Comparator" (w/partial English translation), No date.

"Individual Voltage Comparing Type A/D Converter" (w/partial English translation), No date.

*Primary Examiner*—Todd Deboer
*Attorney, Agent, or Firm*—Cushman, Darby & Cushman IP Group of Pillsbury Madison & Sutro LLP

[57] ABSTRACT

An analog to digital converter comprises: first to $n^{th}$ comparators, having a tandem structure, for comparing an input voltage signal with first to $n^{th}$ reference voltages and outputting first to $n^{th}$ bit outputs respectively, said n being a natural number more than one, said first comparator outputting a most significant bit of said first bit output; a first reference voltage generation circuit for generating said first reference voltage; second to $n^{th}$ reference voltage generation circuits for generating said second to $n^{th}$ reference voltages, $p^{th}$ reference voltages being generated in accordance with outputs of said first to $(p-1)^{th}$ comparators, said p being a natural number and $1<p<n$.

10 Claims, 6 Drawing Sheets

FIG. 4

| INPUT | OUTPUT | | |
|---|---|---|---|
| | OUT1 | OUT2 | OUT3 |
| Vcc ~ VB$_7$ | H | H | H |
| VB$_7$ ~ VB$_6$ | H | H | L |
| VB$_6$ ~ VB$_5$ | H | L | H |
| VB$_5$ ~ VB$_4$ | H | L | L |
| VB$_4$ ~ VB$_3$ | L | H | H |
| VB$_3$ ~ VB$_2$ | L | H | L |
| VB$_2$ ~ VB$_1$ | L | L | H |
| VB$_1$ ~ 0 | L | L | L |

$$VB_3 = \frac{R_8}{R_7 + R_8} Vcc \qquad VB_1 = \frac{R_8}{R_6 + R_7 + R_8} Vcc$$

$$VB_2 = \frac{R_4}{R_3 + R_4} Vcc \qquad VB_6 = \frac{R_4 + R_5}{R_3 + R_4 + R_5} Vcc$$

$$VB_7 = \frac{R_8 + R_9}{R_7 + R_8 + R_9} Vcc \qquad VB_5 = \frac{R_8 + R_9}{R_6 + R_7 + R_8 + R_9} Vcc$$

$$VB_4 = \frac{R_2}{R_1 + R_2} Vcc$$

FIG. 6

| INPUT | OUTPUT | | | |
|---|---|---|---|---|
| | OUT1 | OUT2 | OUT3 | OUT4 |
| $V_{CC} \sim VC_{15}$ | H | H | H | H |
| $VC_{15} \sim VC_{14}$ | H | H | H | L |
| $VC_{14} \sim VC_{13}$ | H | H | L | H |
| $VC_{13} \sim VC_{12}$ | H | H | L | L |
| $VC_{12} \sim VC_{11}$ | H | L | H | H |
| $VC_{11} \sim VC_{10}$ | H | L | H | L |
| $VC_{10} \sim VC_9$ | H | L | L | H |
| $VC_9 \sim VC_8$ | H | L | L | L |
| $VC_8 \sim VC_7$ | L | H | H | H |
| $VC_7 \sim VC_6$ | L | H | H | L |
| $VC_6 \sim VC_5$ | L | H | L | H |
| $VC_5 \sim VC_4$ | L | H | L | L |
| $VC_4 \sim VC_3$ | L | L | H | H |
| $VC_3 \sim VC_2$ | L | L | H | L |
| $VC_2 \sim VC_1$ | L | L | L | H |
| $VC_1 \sim 0$ | L | L | L | L | ved reference voltages are employed. However, there are
ANALOG TO DIGITAL CONVERTER

BACKGROUND OF THE INVENTION

1. Field of the Invention

This invention relates to an analog to digital converter for converting an analog signal to a digital signal.

2. Description of the Prior Art

Analog to digital (a/d) converters of a feedback comparing type or a successive approximation type and a non-feedback comparing type or parallel type are known. The parallel type of a/d converter determines all bit values by comparing an input analog voltage with a precisely divided reference voltages. The parallel type of a/d converter provides a high speed conversion because statically precisely divided reference voltages are employed. However, there are a lot of comparing circuits and a lot of elements in the circuit. FIG. 2A is a block diagram of a prior art parallel type of a/d converter having two-bit outputs. In this case, the number of resolution is four. There are four resistors R21, R22, R23, and R24 connected in series. Voltages at junction points between theses resistors VZ1, VZ2, and VZ3 are fed to the negative inputs of three comparators 21 to 23 as reference voltages, respectively. The output of this prior art a/d converter is determined by the values of outputs of the comparators 21 to 23 through a logic circuit. FIG. 2B shows a truth table of this prior art a/d converter. The reference voltages VZ1, VZ2, and VZ3 are determined by the resistances of respective resisters R21 to R24 and a supply voltage Vcc. This prior art a/d converter provides a high speed conversion. However, there are problems in that require increasing in resolution increases the number of comparing circuits and the number of resisters for generating the reference voltages. As a result, the conversion accuracy decreases with the rise in the resolution.

SUMMARY OF THE INVENTION

The present invention has been developed in order to remove the above-described drawbacks inherent in the conventional analog to digital converter.

According to the present invention a there is provided an analog to digital converter for converting a voltage signal to an n-bit digital signal, comprising: a comparing circuit having first to $n^{th}$ stages of comparators of a tandem structure, responsive to an input voltage signal, the first to $n^{th}$ stages of comparators outputting n-bit comparing results using first, second to $n^{th}$ reference voltages respectively, such that the n-bit comparing results are successively determined from a higher bit; and a reference voltage switching circuit for generating the n reference voltages such that one of the n reference voltages is changed in accordance with a portion of the n-bit comparing results of early stages of the n stages of comparators.

In the above-mentioned a/d converter, the reference voltage switching circuit changes one of second to $n^{th}$ reference voltages such that the second to the $n^{th}$ reference voltages are increased when a first stage of comparator outputs "1" and the second to the $n^{th}$ reference voltages are decreased when the first stage of comparator outputs "0".

In the above-mentioned a/d converter, the reference voltage switching circuit comprises: first, second to $n^{th}$ voltage dividing circuits, each voltage dividing circuit having a plurality of resistors; and first to $(n-1)^{th}$ stages of switch circuits controlling voltages junction points in the second to $n^{th}$ voltage dividing circuit respectively. Moreover, $m^{th}$ voltage dividing circuit of the first, second to $n^{th}$ voltage dividing circuits divides a supply voltage into voltage ranges of $2^m$, m being a natural number and $m \leq n$. Further, one of the first to $(n-1)^{th}$ stages of switch circuits responds a portion of the n-bit comparing results of the early stage of the first to $n^{th}$ stages of comparators. Still further, one of the first to $(n-1)^{th}$ stages of switch circuits further comprises an inverter which responds at least one of the n-bit comparing results of the early stage of the first to $n^{th}$ stages of comparators.

According to the present invention, there is further provided an analog to digital converter comprises: first to $n^{th}$ comparators having a tandem structure for comparing an input voltage signal with first to $n^{th}$ reference voltages and outputting first to $n^{th}$ bit outputs respectively, n being a natural number more than one, the first comparator outputting a most significant bit of the first bit output; a first reference voltage generation circuit for generating the first reference voltage; second to $n^{th}$ reference voltage generation circuits for generating the second to $n^{th}$ reference voltages, $p^{th}$ reference voltages being generated in accordance with outputs of the first to $(p-1)^{th}$ comparators, p being a natural number and $1 < p < n$.

BRIEF DESCRIPTION OF THE DRAWINGS

The object and features of the present invention will become more readily apparent from the following detailed description taken in conjunction with the accompanying drawings in which:

FIG. 4 shows a truth table for the second embodiment showing the relation between a voltage of the input signal and the outputs of the a/d converter of the second embodiment and equations for determining reference voltages in the second embodiment;

FIG. 6 shows a table of the third embodiment showing the relation between a voltage of the input signal and the outputs of the a/d converter of the third embodiment.

The same or corresponding elements or parts are designated as like references throughout the drawings.

DETAILED DESCRIPTION OF THE INVENTION

Hereinbelow will be described a first embodiment of this invention.

Figure 1:
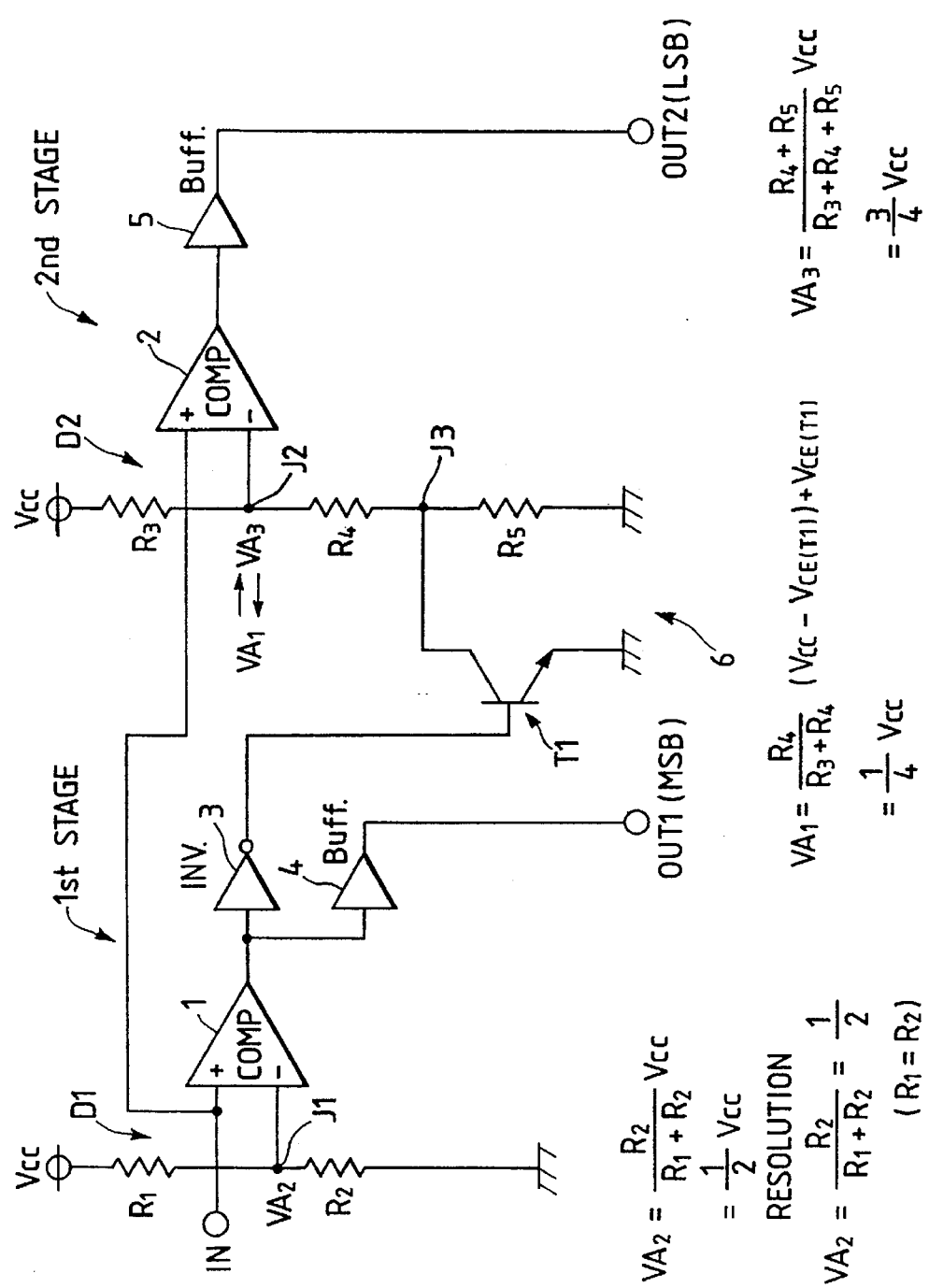
FIG. 1 is a block diagram of a first embodiment showing a structure of a first analog to digital converter having a two-bit output.
Figure 2:
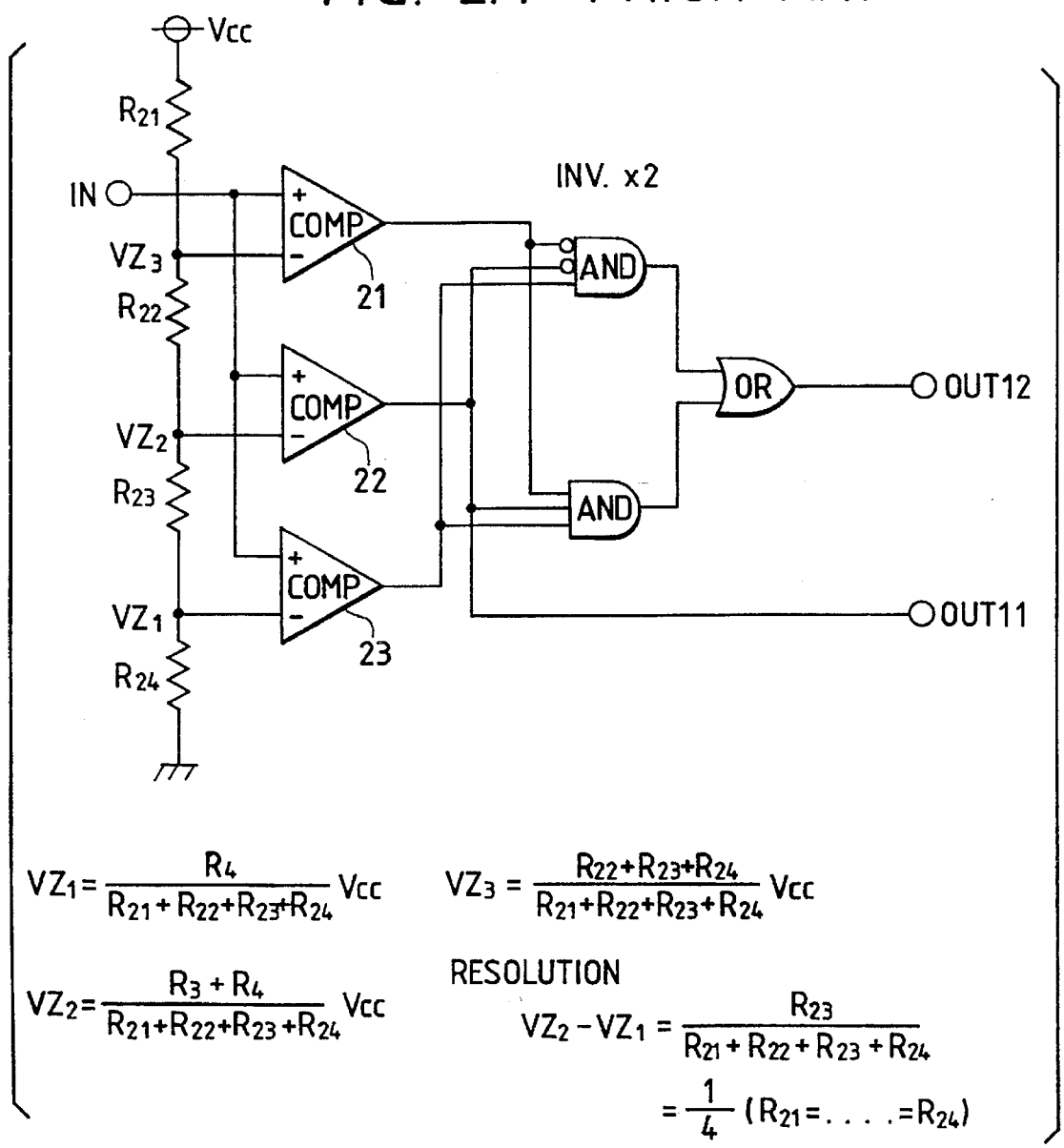
FIG. 2A is a block diagram of a conventional parallel type of a/d converter having a two-bit output.
FIG. 2B shows a truth table for this conventional a/d converter.

FIG. 1 is a block diagram of the first embodiment showing a structure of an analog to digital (a/d) converter having a two-bit output. This first a/d converter comprises: a first voltage divider D1 including resistors R1 and R2 having the same resistance connected between a supply voltage Vcc and ground in series via a first junction point J1 therebetween for supplying a first reference voltage VA2, a first comparator 1 having a positive input receiving an input analog voltage from an input terminal IN and a negative input receiving the reference voltage VA2, a second voltage divider D2 including resistors R3, R4, and R5 connected between the supply voltage Vcc and ground in series via a second junction point J2 between the resistors R3 and R4 and a third junction point J3 between the resistors R4 and R5, one end of the resistor R3 receiving the supply voltage Vcc, the second junction point J2 supplying a second reference voltage VA1 or VA3, a second comparator 2 having a positive input receiving the input analog voltage from the input terminal IN and a negative input receiving the second reference voltage from the second junction point J2 between the resistors R3 and R4, an inverter 3 for inverting an output of the first comparator 1, an npn transistor T1 as a switch having a base responsive to an output off the inverter 3 and a collector connected to the third junction point J3 between the resistors R4 and R5, and an emitter connected to the ground, a first buffer 4 for buffering the output of the comparator 1 and providing a high digit output, i.e., MSB, at output terminal OUT1, a second buffer 5 for buffering an output of the second comparator 2 and providing a low digit output, i.e., LSB, wherein the first reference voltage provides a half of the supply voltage Vcc and the second reference voltage provides one fourth of the supply voltage Vcc as VA1 (=¼ Vcc) when the output of the comparator 1 is L and three fourths of the supply voltage Vcc as VA3 (=¾ Vcc) when the output of the comparator 1 is H.

The first reference voltage VA2, which is a half of the supply voltage Vcc, is obtained by dividing a voltage between the supply voltage Vcc and the ground by resistors R1 and R2, wherein the supply voltage Vcc is sufficiently larger than the input analog voltage to be judged. Therefore, the supply voltage Vcc is set to a predetermined voltage in accordance with an operational condition and the reference voltage VA2 is given by:

$$V2 = R2 \cdot Vcc/(R1+R2) \quad (1)$$

The comparator 1 compares the input analog voltage with the first reference voltage VA2 (=½ Vcc) and outputs a result of H or L logic output as MSB (most significant bit) at the output terminal OUT1. The MSB output is supplied through the inverter 3 to a control input of a reference voltage switching circuit 6 including the second voltage divider D2 and the transistor T1, namely, the base of the transistor T1, for switching the second reference voltage between VA1 and VA3. The reference voltage switching circuit provides one fourth of the supply voltage Vcc, i.e., VA1, when the output of the comparator 1 is L because the transistor T1 as a switch shorts both ends of the resistor R5 or makes a potential at the junction point J3 to the ground potential substantially. On the other hand, when the output of the comparator 1 is H, the reference voltage switching circuit provides three fourths of the supply voltage Vcc, i.e., VA3, because the transistor T1 shows a high impedance between the collector and emitter connected to both ends of the resistor R5 respectively. More specifically, resistances of R3 and R4 are determined such that one fourth of the supply voltage Vcc, i.e., VA1, is provided at the junction point J2 between the resistors R3 and R4 when the output of the comparator 1 is L. Here, the resistances of R3 and R4 should be determined in consideration of the voltage difference between the collector and the emitter of the transistor T1, i.e., a forward voltage drop of the transistor T1 or a saturated voltage between the collector and the emitter $V_{CE\ (SAT)}$. Here, this saturated voltage $V_{CE\ (SAT)}$ is small if the transistor T1 is of MOS type (metal oxide semiconductor). Therefore, the reference voltage VA1 is given by:

$$VA1 = R4(V_{cc} - V_{CE(T1)})/(R3+R4) + V_{CE(T1)} \quad (2)$$

where $V_{CE(T1)}$ is a voltage difference between the collector and the emitter of the transistor T1 when the output of the comparator is L. Moreover, resistances of R3 to R5 are determined such that three fourths of the supply voltage Vcc, i.e., VA3, is provided at the junction point J2 between the resistors R3 and R4 when the output of the comparator 1 is H. Therefore, the reference voltage VA3 is given by:

$$V3 = (R4+R5)V_{cc}/(R3+R4+R5) \quad (3)$$

In other words, the reference voltage switching circuit 6 provides one fourth of the supply voltage Vcc when the input analog voltage would be represented as "00" and "01" and three fourths the supply voltage Vcc when the input analog voltage would be represented as "10" and "11". The buffers 4 and 5 are provided for stabilizing the output of this a/d converter and includes CMOS (complementary metal oxide semiconductor) type semiconductor circuits.

The reference voltage VA2 is a half of the supply voltage Vcc and is determined by only resistances of resistors R1 and R2. In other words, the reference voltage VA2 is determined by the accuracy of the resistors R1 and R2. However, the reference voltages VA1 and VA3 are one fourth and three fourths of the supply voltage Vcc respectively and are determined by the resistances of the resistor R3 to R5 and the forward voltage drop $V_{CE\ (T1)}$ of the transistor T1 because the resistance R5 is larger than ON-resistance of the transistor T1, so that the voltage difference across the resistor R5 is determined by the forward voltage drop of the transistor T1 when the transistor T1 is in ON state. When the transistor T1 is OFF. The reference voltage VA3 is determined only by the resistances of resistors R3 to R5.

Figure 3:
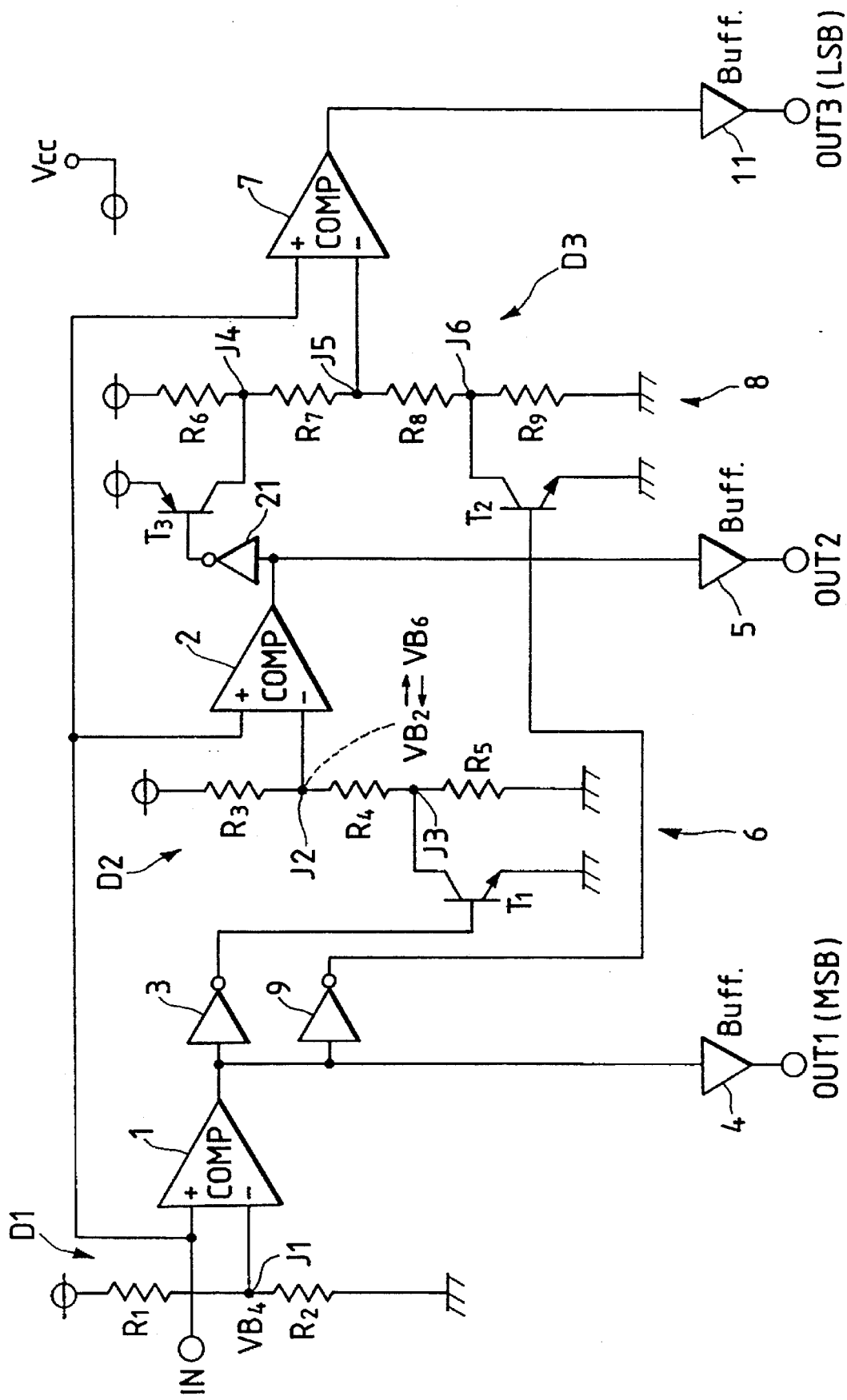
FIG. 3 is a block diagram of a second embodiment of an a/d converter having a three-bit output.

FIG. 3 is a block diagram of a second embodiment of an a/d converter having a three-bit output.

The a/d converter having a three-bit output comprises a comparator 7 for the LSB and a reference voltage switching circuit 8 including an inverter 9 and an inverter 21 in addition of the a/d converter having a two-bit output of the first embodiment.

The reference voltage switching circuit 8 comprises a voltage divider D3 having resistors R6 to R9 connected between the supply voltage Vcc and ground in series, one end of the resistor R6 being connected to the supply voltage Vcc, one end of the resistor R9 being connected to the ground, a pnp transistor T3 as a switch having an emitter connected to the supply voltage Vcc, a collector connected to a junction point J4 between the resistors R6 and R7, and a base connected to an output of the inverter 21 for inverting the output of the comparator 2, and inverter 9 for inverting the output of the comparator 1, and a npn transistor T2 having a collector connected to a junction point J6 between the resistors R8 and R9, an emitter connected to the ground, and a base connected to an output of the inverter 9. The comparator 7 has a positive input receiving the input voltage signal and a negative input connected to a junction point J5 between the resistors R7 and R8. An output of the comparator 7 is provided to at an output terminal OUT3 as the LSB through a buffer 11.

The transistor T3 substantially supplies the supply voltage Vcc to the junction point J4 when the output of the comparator 2 is H and the transistor T2 makes the potential of the junction point J6 to the ground potential when the output of the comparator 1 is L. Here, the forward voltage crops of the transistors T2 and T3 are neglected.

FIG. 4 shows a table showing the relation between a voltage of the input signal and the outputs OUT1 to OUT3 and equations determining relations between reference voltages and registers R3 to R9 in the second embodiment. Here, for example, it is assumed that the supply voltage Vcc is 8 volts. Theses reference voltages VB1 to VB7 are 1 to 7 volts respectively. If the voltage of the input voltage signal is between 0 to 1 volt, all outputs OUT1 to OUT3 are L. If the voltage of the input voltage signal is between 4 and 5 volts, the output OUT1 is H and the outputs OUT2 and OUT 3 are L. IF the voltage of the input voltage signal is between 7 to 8 volts, all outputs are H. Therefore, the analog input voltage signal is converted into a three-bit digital signal.

Figure 5:
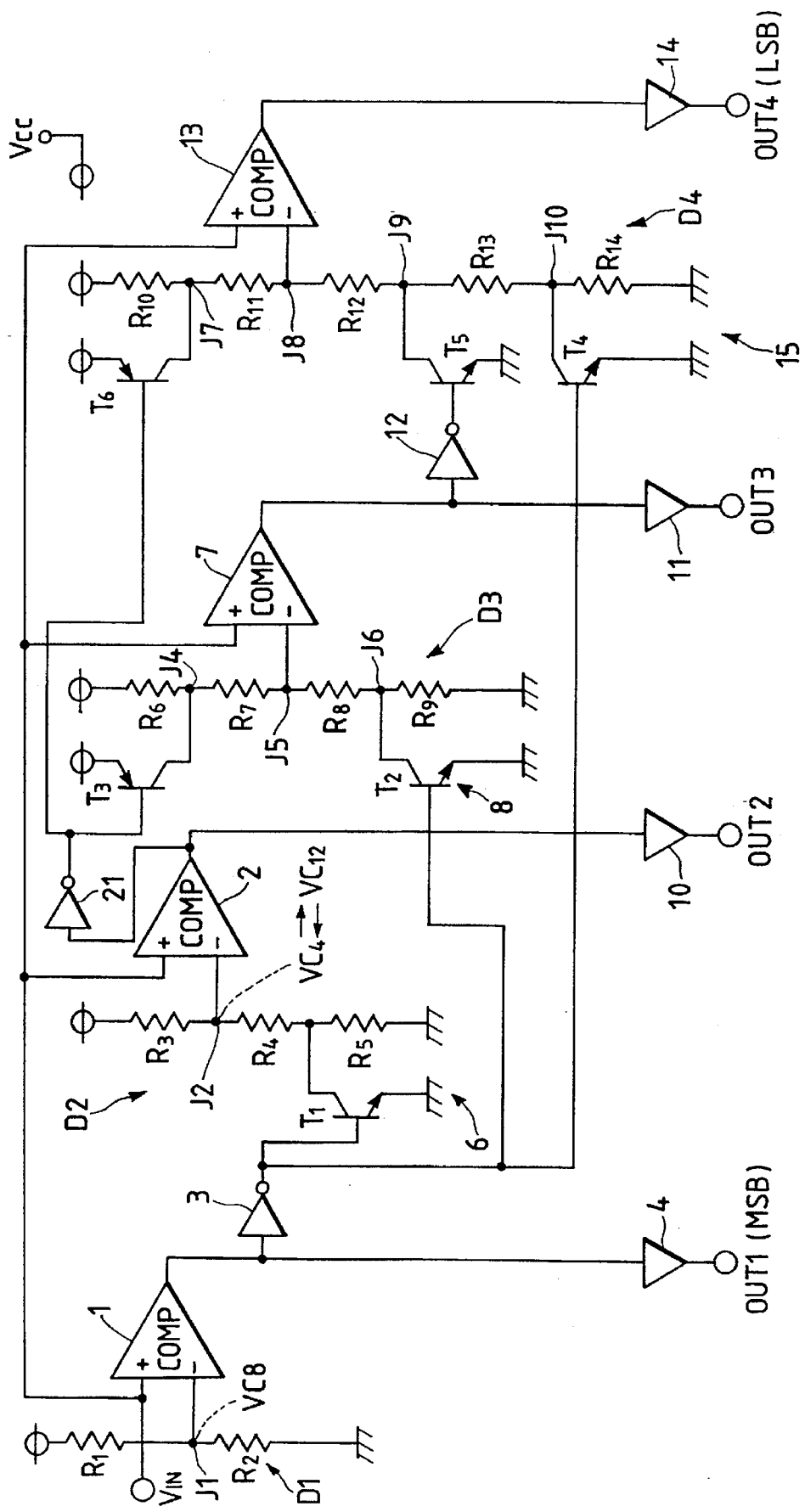
FIG. 5 is a block diagram of a third embodiment of this invention showing a four-bit digital a/d converter.

FIG. 5 is a block diagram of a third embodiment of this invention of a four-bit digital a/d converter.

The four-bit a/d converter comprises a reference voltage switching circuit 15 and a comparator 13 for the LSB in addition of the a/d converter having three-bit output of the second embodiment.

The reference voltage switching circuit 15 comprises a voltage divider D4 having resistors R10 to R14 connected between the supply voltage Vcc and the ground in series, one end of the resistor R10 being connected to the supply voltage Vcc, one end of the resistor R14 being connected to ground, a pnp transistor T6 as a switch having an emitter connected to the supply voltage Vcc, a collector connected to a junction point J7 between the resistors R10 and R11, and a base connected to the output of the comparator 2, and inverter 12 for inverting the output of the comparator 7, an npn transistor T5 having a collector connected to a junction point J9 between the resistors R12 and R13, an emitter connected to the ground, and a base connected to an output of the inverter 12, and an npn transistor T4 having a collector connected to a junction point J10 between the resistors R13 and R14, an emitter connected to the ground, and a base connected to an output of the inverter 3. The comparator 13 has a positive input receiving the input voltage signal and a negative input connected to a junction point J8 between the resistors R11 and R12. An output of the comparator 13 is provided to at an output terminal OUT4 as the LSB through a buffer 14.

The transistor T6 substantially supplies the supply voltage Vcc to the junction point J7 when the output of the comparator 2 is H and the transistor T5 makes the potential of the junction point J9 to the ground potential when the output of the comparator 7 is L. Further, the transistor T4 makes the potential of the junction point J10 to the ground potential when the output of the comparator 1 is L. Here, the forward voltage drops of the transistors T1 to T6 are neglected.

FIG. 6 shows a table of the third embodiment showing the relation between a voltage of the input signal and the outputs of the a/d converter of the third embodiment. Here, for example, it is assumed that the supply voltage Vcc is 16 volts. Theses reference voltages VC1 to VC15 are 1 to 15 volts respectively. If the voltage of the input voltage signal is between 0 to 1 volt (VC1-0), all outputs OUT1 to OUT4 are L. If the voltage of the input voltage signal is between 8 and 9 volts (VC9-Vc8), the output OUT1 is H and the outputs OUT2 to OUT 4 are L. If the voltage of the input voltage signal is between 15 to 16 volts (Vcc-VC15), all outputs are H. Therefore, the analog input voltage signal is converted into a four-bit digital signal.

In this embodiment, equations indicating relations between resistances and reference voltages are omitted. However, resistances of the resistor R10 to R14 can be determined in the similar manner to the first and second embodiments. Here, it becomes difficult to determine combinations of resistors with an increase in the number of bits. Further, the forward voltage drop should be considered. However, theses resistors R1 to E14 can be trimmed by forming trimming resistors (not shown) when the circuit of the a/d converters are formed by the photolithographical technique, so that the desired reference voltages can be readily obtained.

Therefore, even if the scale of the a/d converter increases, the input analog voltage can be judged precisely. Therefore, there is provided an a/d converter with fewer elements than the conventional a/d converters. That is, the number of transistors and resistors (the number of gates) for forming the a/d converter of the first, the second, or the third embodiments, can be reduced by about 40% as compared to the conventional a/d converter. Moreover, the resolution in the first stage of the comparing circuit, that is, the comparator 1 is one fourth to a half of the conventional type of the conventional a/d converters, so that a noise margin in the first stage of the comparing circuit about twice that of the conventional a/d converters. Here, the noise margin is means that if a noise pulse having a duration corresponding to or less than a delay time in the first comparing circuit and its outputting element, i.e., inverter and transistors T2 and T5, is input on the input analog voltage, the a/d converter according to this invention is not affected by the noise pulse.

As mentioned above, according to this invention, there is provided the a/d converter comprises: first to $n^{th}$ comparators 1, 2, 7, and 13, having a tandem structure, for comparing the input voltage signal with first to $n^{th}$ reference voltages and outputting first to $n^{th}$ bit outputs respectively, n being a natural number more than one, the first comparator 1 outputting the most significant bit of the first bit output OUT1; a first reference voltage generation circuit D1 including resistors R1 and R2 for generating the first reference voltage; second to $n^{th}$ reference voltage generation (switching) circuits 8 and 15 for generating the second to $n^{th}$ reference voltages, $p^{th}$ reference voltages being generated in accordance with outputs of the first to $(p-1)^{th}$ comparators 1, 2, and 7 the p being a natural number and 1<p<n.

What is claimed is:

1. An analog to digital converter for converting an analog voltage signal to n-bit digital signal, comprising:

a comparing circuit, having first to $n^{th}$ stages of comparators, having a tandem structure, responsive to an input voltage signal, said first to $n^{th}$ stages of comparators outputting first to $n^{th}$ comparing results using first, second to $n^{th}$ reference voltages, respectively, such that said first comparing result is determined from said first reference voltage and said second to $n^{th}$ comparing results are successively determined from a higher bit; and a reference voltage switching circuit for generating said reference voltages such that one of said second to $n^{th}$ reference voltages is changed in accordance with a portion of said n-bit comparing results of an earlier stage of said first to $n^{th}$ stages of comparators, wherein said reference voltage switching circuit changes said second to $n^{th}$ reference voltage such that said second to said $n^{th}$ reference voltages are increased responsive to a first stage comparator outputting a "1" and said second to said $n^{th}$ reference voltages are decreased responsive to said first stage comparator outputting a "0".

2. An analog to digital converter as claimed in claim 1, wherein said reference voltage switching circuit comprises:

first, second to $n^{th}$ voltage dividing circuits, each voltage dividing circuit having a plurality of resistors; and first to $(n-1)^{th}$ stages of switch circuits controlling voltages at junction points in said second to $n^{th}$ voltage dividing circuits respectively.

3. An analog to digital converter as claimed in claim 2, wherein $m^{th}$ voltage dividing circuit of said first, second to $n^{th}$ voltage dividing circuits divides a supply voltage into voltage ranges of $2^m$, m being a natural number and $m \leq n$.

4. An analog to digital converter as claimed in claim 2, wherein one of said first to $(n-1)^{th}$ stages of switch circuits responds a portion of said n-bit comparing results of an early stage of said first to $n^{th}$ stages of comparators.

5. An analog to digital converter as claimed in claim 4, wherein said one of said first to $(n-1)^{th}$ stages of switch circuits further comprises an inverter which responds to at least one of said n-bit comparing results of said early stage of said first to $n^{th}$ stages of comparators.

6. An analog to digital converter comprising:

first to $n^{th}$ comparators, having a tandem structure, for comparing an analog input voltage signal with first to $n^{th}$ reference voltages and outputting first to $n^{th}$ bit outputs respectively, n being a natural number more than one, said first comparator outputting said first bit output as a most significant bit;

a first reference voltage generation circuit for generating said first reference voltage; and second to $n^{th}$ reference voltage generation circuits for generating said second to $n^{th}$ reference voltages, reference voltages respectively, $p^{th}$ reference voltages being generated in accordance with outputs of said first to $(p-1)^{th}$ comparators, p being a natural number and $1<p<n$, wherein said second to $n^{th}$ reference voltage generation circuits respectively change said second to $n^{th}$ reference voltages such that said second to said $n^{th}$ reference voltages are increased responsive to said first comparator outputting a "1" and said second to $n^{th}$ reference voltages are decreased responsive to said first comparator outputting a "0".

7. An a/d converter comprising:

a first voltage divider having resistors R1 and R2 connected in series between a supply voltage and ground via a first junction point therebetween for supplying a first reference voltage;

a first comparator having a first input receiving an input analog voltage and a second input receiving said first reference voltage;

a second voltage divider having resistors R3, R4, and R5 connected in series between said supply voltage and ground via a second junction point between said resistors R3 and R4 and a third junction point between said resistors R4 and R5, one end of said resistor R1 receiving said supply voltage, said second junction point supplying a second reference voltage;

a second comparator having a third input receiving said input analog voltage and a fourth input receiving said second reference voltage from said second junction point between said resistors R3 and R4; and a switch, having a control input responsive to an output of said first comparator, for controlling a potential at said third junction point between said resistors R4 and R5.

8. An a/d converter as claimed in claim 7, wherein said first voltage divider provides one half of said supply voltage, and said second voltage divider provides one fourth of said supply voltage responsive to said output of said first comparator being "0" and three fourths of said supply voltage responsive to said output of said first comparator being "1".

9. An analog to digital converter for converting a voltage signal to an n-bit digital signal, comprising:

a comparing circuit, having first to $n^{th}$ stages of comparators, having a tandem structure, responsive to an input voltage signal, said first to $n^{th}$ stages of comparators outputting first to $n^{th}$ bit comparing results using first, second to $n^{th}$ reference voltages, respectively, such that said first comparing result is determined from said first reference voltage and said second to $n^{th}$ comparing results are successively determined from a higher bit; and a reference voltage switching circuit for generating said reference voltages such that one of said second to $n^{th}$ reference voltages is changed in accordance with a portion of said n-bit comparing results of an earlier stage of said of comparators, wherein said reference voltage switching circuit comprises:

first, second, to $n^{th}$ voltage dividing circuits, each voltage dividing circuit having a plurality of resistors; and first to $(n-1)^{th}$ stages of switch circuits controlling voltages at junction points in said second to $n^{th}$ voltage dividing circuits respectively, wherein one of said first to $(n-1)^{th}$ stages of switch circuits responds a portion of said n-bit comparing results of an early stage of said first to $n^{th}$ stages of comparators.

10. An analog to digital converter as claimed in claim 9, wherein said one of said first to $(n-1)^{th}$ stages of switch circuits further comprises an inverter which responds to at least one of said n-bit comparing results of said early stage of said first to $n^{th}$ stages of comparators.

* * * * *